(12) United States Patent
Haggenmiller et al.

(10) Patent No.: US 10,181,736 B2
(45) Date of Patent: Jan. 15, 2019

(54) METHOD FOR OPERATING A CIRCUIT ARRANGEMENT FOR CHARGING AND DISCHARGING A CAPACITIVE ACTUATOR

(71) Applicant: CONTINENTAL AUTOMOTIVE GMBH, Hannover (DE)

(72) Inventors: Christoph Haggenmiller, Regensburg (DE); Raul Lucian Alimareanu Torok, Timisoara (RO); Emilian Gheorghe Lukic, Recas (RO)

(73) Assignee: Continental Automotive GmbH, Hannover (DE)

( * ) Notice: Subject to any disclaimer, the term of this patent is extended or adjusted under 35 U.S.C. 154(b) by 147 days.

(21) Appl. No.: 14/499,487

(22) Filed: Sep. 29, 2014

(65) Prior Publication Data

US 2015/0171652 A1    Jun. 18, 2015

(30) Foreign Application Priority Data

Sep. 27, 2013   (DE) .......................... 10 2013 219 609

(51) Int. Cl.
*H01L 41/00* (2013.01)
*H02J 7/00* (2006.01)
(Continued)

(52) U.S. Cl.
CPC .......... *H02J 7/0052* (2013.01); *H01L 41/042* (2013.01); *H02J 7/0063* (2013.01);
(Continued)

(58) Field of Classification Search
CPC .................................................... H02J 7/0052
(Continued)

(56) References Cited

U.S. PATENT DOCUMENTS 6,081,062 A    6/2000   Hoffmann et al.
6,147,433 A *  11/2000  Reineke ............. F02D 41/2096
                                                310/316.03
(Continued)

FOREIGN PATENT DOCUMENTS

CN    1241300 A    1/2000
CN    1386959 A    12/2002
(Continued)

*Primary Examiner* — Drew A Dunn
*Assistant Examiner* — Jerry D Robbins
(74) *Attorney, Agent, or Firm* — Laurence A. Greenberg; Werner H. Stemer; Ralph E. Locher

(57) ABSTRACT

A method for operating a circuit for charging and discharging a capacitive actuator. The circuit has a series circuit of first and second power transistors with respective parallel-connected diodes connected between the potentials of a supply voltage source. The node between the power transistors is connected via a coil to the capacitive actuator. For charging the actuator, the first power transistor, which connects the capacitive actuator to the positive potential, is periodically turned on during a prescribed time and turned off when a first prescribed threshold value is reached by the current through the actuator, until a lower threshold value is reached by the current. If the actuator current no longer reaches the first prescribed threshold value then the first power transistor is turned off after a time that corresponds to the maximum value reached by the actuator current.

3 Claims, 2 Drawing Sheets

(51) Int. Cl.
  *H01L 41/04* (2006.01)
  *H02N 2/06* (2006.01)
  *H02J 7/34* (2006.01)

(52) U.S. Cl.
  CPC .............. *H02J 7/345* (2013.01); *H02N 2/06* (2013.01); *H02N 2/067* (2013.01)

(58) Field of Classification Search
  USPC ........................................................ 320/166
  See application file for complete search history.

(56) References Cited

U.S. PATENT DOCUMENTS

| | | | |
|---|---|---|---|
| 6,384,512 B1 * | 5/2002 | Maeda | ............... F02D 41/2096 310/316.03 |
| 8,004,162 B2 | 8/2011 | Koike et al. | |
| 8,461,794 B2 | 6/2013 | Schrod et al. | |
| 8,525,488 B2 | 9/2013 | Fuchs et al. | |
| 2003/0164160 A1 * | 9/2003 | Schrod | ............... F02D 41/2096 123/490 |
| 2005/0241309 A1 | 11/2005 | McEwen et al. | |
| 2006/0166519 A1 | 7/2006 | Telep et al. | |
| 2007/0108772 A1 | 5/2007 | Shibui et al. | |
| 2007/0199318 A1 | 8/2007 | Wood | |
| 2008/0042624 A1 | 2/2008 | Augesky et al. | |
| 2008/0088262 A1 * | 4/2008 | Bolz | ................... F02D 41/2096 318/116 |
| 2010/0045244 A1 * | 2/2010 | Fuchs | ................... H02N 2/067 320/166 |
| 2010/0080693 A1 | 4/2010 | Grzonkowski | |
| 2010/0129205 A1 | 5/2010 | Schwerdel | |

FOREIGN PATENT DOCUMENTS

| | | |
|---|---|---|
| CN | 1854482 A | 11/2006 |
| CN | 1912364 A | 2/2007 |
| CN | 101027469 A | 8/2007 |
| CN | 101542089 A | 9/2009 |
| CN | 101647130 A | 2/2010 |
| CN | 101661989 A | 3/2010 |
| DE | 2941704 A1 | 4/1980 |
| DE | 19814594 A1 | 10/1999 |
| DE | 102004047961 A1 | 5/2006 |
| DE | 102007055630 A1 | 5/2009 |
| DE | 102008022947 A1 | 11/2009 |
| EP | 1217667 A2 | 6/2002 |

* cited by examiner

METHOD FOR OPERATING A CIRCUIT ARRANGEMENT FOR CHARGING AND DISCHARGING A CAPACITIVE ACTUATOR

BACKGROUND OF THE INVENTION

Field of the Invention

Method for operating a circuit arrangement for charging and discharging a capacitive actuator.

The invention relates to a method for operating a circuit arrangement for charging and discharging at least one capacitive actuator, which circuit arrangement has a series circuit comprising a first and a second power transistor with a respective parallel-connected diode that is connected up between the potentials of a supply voltage source, wherein the connecting node between the two power transistors is connected via a coil to a connection of the at least one capacitive actuator. Charging the capacitive actuator involves the first power transistor, which connects the capacitive actuator to the positive potential of the supply voltage source, being periodically turned on during a prescribable period of time and turned off again when a first prescribed threshold value is reached by the current through the capacitive actuator, until a second prescribed threshold value, which is lower than the first threshold value, is reached by the actuator current.

Such a method is known from DE 198 14 594 A1.

FIG. 1 shows a circuit arrangement that is known from this specification for charging and discharging a capacitive actuator, the capacitive actuator in that case being able to be a piezoactuator for operating a jet needle in a fuel injection valve, for example. For the performance of the method, the only thing that matters is the capacitive property thereof in a charging and discharge circuit, however.

In the known circuit arrangement, the series circuit comprising a first and a second power transistor T1, T2 with a respective parallel-connected diode D1, D2 is connected up between the potentials of a supply voltage source $V_0$, the negative potential of the supply voltage source $V_0$ being used as a reference-ground potential. As in the example shown in FIG. 1, the power transistors T1, T2 may be in the form of MOSFETs or else in the form of IGBTs as in DE 198 14 594 A1 or in another suitable manner. The diodes D1, D2 are connected in a reverse direction between the positive potential of the supply voltage source $V_0$ and the negative potential thereof and may either be provided explicitly as individual components or else, as substrate diodes, may be part of the transistor semiconductor chips.

The connecting node between the two power transistors is connected via a coil $L_{MAIN}$ to connections of, in the example shown, two piezoactuators P1, P2 that act as capacitive actuators. The respective other connections of the two piezoactuators P1, P2 are connected to the reference-ground potential via respective associated selection transistors AT1, AT2. In the circuit example shown, the coil $L_{MAIN}$ and the connections of the capacitive actuators P1, P2 have a low-pass filter connected between them, comprising a filter capacitor $C_{FILT}$ and a filter coil $L_{FILT}$, in order to smooth the charging current.

In the circuit example shown in FIG. 1, two capacitive actuators P1, P2 having a respective selection transistor AT1, AT2 are connected in parallel with one another, but there may also be more or just one capacitive actuator, depending on the application for which the capacitive actuators are used. When used in a fuel injection valve, usually four such capacitive actuators will be connected in parallel with one another for a 4-cylinder engine. When a capacitive actuator in the form of a piezoactuator is used in a fuel injection valve, the piezoactuator is intended to be used to inject as precise as possible an amount of fuel in as short as possible a time, which requires precise expansion of the piezoactuator.

To achieve this, an accurately determined quantity of charge needs to be applied to the piezoactuator acting as a capacitance in a particular time. As a result, as described in DE 198 14 594 A1, pulsed actuation of the power switches connecting the capacitive actuator to a supply voltage source has been found to be advantageous.

Such actuation is indicated in FIG. 2 for charging the capacitive actuator, as shown in FIG. 1, with a similar profile being obtained for discharge only when the current direction is reversed.

The bottom graph in FIG. 2 shows the current $I_{P1}$ through the capacitive actuator P1, wherein turning on the first power transistor T1 forms a flow of current from the supply voltage source $V_0$ via the coil $L_{MAIN}$, the first capacitive actuator P1 and the selection transistor AT1 associated therewith. Owing to the inductance of the coil $L_{MAIN}$, the current rise is admittedly restricted, but the initially still low voltage $U_{P1}$ on the capacitive actuator P1 means that the rise will nevertheless still be relatively steep.

The current rise takes place until a first threshold value SW1 is reached, this usually being ascertained by means of a current measuring resistor, which is not shown in FIG. 1, with the first power transistor T1 being turned off again on the basis of the occurrence of this event by a control circuit, which is likewise not shown in FIG. 1. The magnetic field stored in the coil $L_{MAIN}$ is then reduced again, since a current flows via the diode D2 connected in parallel with the second power transistor T2, the current decreasing until it either reaches a second threshold value SW2, which is a lower value than the first threshold value SW1, or—as in the example in FIG. 2—reaches the value 0 amp, which means that the flow of current comes to a standstill, since the blocking action of the diode D2 means that it is not possible for the charge that is now stored in the capacitive actuator P1 to swing back via the coil $L_{MAIN}$. This process is repeated periodically during a period of time that can be prescribed.

A period of time that can be prescribed means a period of time that is either prescribed as a defined period or else runs until a particular voltage $U_{P1}$ is reached on the capacitive actuator.

Since the voltage $U_{P1}$ on the capacitive actuator P1 rises from charging period to charging period with the charge applied thereby, the voltage difference between the voltage $U_{P1}$ on the capacitive actuator P1 and the voltage of the supply voltage source $V_0$ becomes ever smaller, as a result of which the gradient of the rise in the current $I_{P1}$ decreases to an ever greater extent, as can be seen from FIG. 2. At the same time, however, the decrease in the current after the first power transistor T1 is turned on will take place ever faster from charging period to charging period. This can also be seen in FIG. 2.

In the ideal profile, shown in FIG. 2, of the charging current $I_{P1}$ and the resultant rise in the voltage $U_{P1}$ on the capacitive actuator P1, a mean charging current/$I_{P1}$ is obtained that is almost constant and results in a correspondingly linear rise in the voltage $U_{P1}$ on the capacitive actuator P1.

It is now desirable firstly to obtain actuator voltages that are as high as possible but secondly to keep the output voltage from the supply voltage source within limits, since said output voltage needs to be obtained from the voltage of a motor vehicle battery, for example by means of a DC-DC transformer. The higher the output voltage of the supply voltage source, usually the more costly the DC-DC transformer required.

If the actuator voltage now increases to an ever greater extent during a charging process, the difference between the output voltage of the supply voltage source and the actuator voltage therefore becomes ever smaller, which means that when the output voltage of the supply voltage source is limited it may be that the charging current no longer reaches the prescribed upper threshold value and accordingly the charging current comes to a standstill only when the first half-cycle of a charging oscillation is ended.

This is shown in FIG. 3. Curve 1) shows a current profile for a sufficiently large voltage difference between the capacitive actuator P1, P2 and the supply voltage source $V_0$. The upper limit value SW1 is reached and, after the first power transistor T1 has been turned off, the charging current will flow via the freewheeling diode D2 and decrease until the energy stored in the coil $L_{MAIN}$ has been transferred to the capacitive actuator P1, P2. Usually, a new charging pulse then begins until the charging process is ended. Curve 2) now shows the case in which the charging current just reaches the upper threshold value SW1 at the instant Ton_max and the first power transistor T1 can therefore still be switched off. With every further charging pulse, the upper threshold value SW1 is, as indicated by curve 3), no longer reached and as a result the first power transistor T1 is no longer switched off. The current therefore has a sinusoidal half-cycle profile, and the charging pulse is ended only when the current has become 0 amp again, which occurs at an instant Tosc.

The charge applied by the charging current pulse corresponds to the surface area beneath curve 3), and it can be seen that this charge is much greater than the applied charges for charging curves 1) and 2), resulting in an uneven charging profile and hence an uneven movement in the jet needle of a fuel injection valve, which jet needle is driven by the capacitive actuator, for example.

BRIEF SUMMARY OF THE INVENTION

It is therefore an object of the invention to avoid this problem.

The object is achieved by a method according to claim 1.

According to the invention, the aim is thus that, in the case of a method according to the preamble of claim 1, if the actuator current no longer reaches the first prescribed threshold value, the first power transistor is turned off after a period that corresponds to the maximum value reached by the actuator current and that follows the instant at which the maximum value is reached.

Hence, the charging current is shut down by time control, with the time until shutdown being intended to be dependent on the maximum current reached that can be ascertained. The smaller this maximum current, the longer the first power transistor is meant to remain switched on, which means that approximately the same charge is applied to the capacitive actuator with each charging pulse.

Alternatively, according to claim 2, the shutdown can occur after a firmly prescribed period that follows the instant at which the maximum value is reached. Hence, although only relatively inaccurate charging of the capacitive actuator is achieved, this method is less complex.

A further alternative, which leads to a better result, is specified in claim 3. On the basis of the latter, shutdown is intended to occur when, after the instant at which the maximum value is reached, a period has elapsed that is dependent on the maximum value reached by the actuator current, the period for reaching this value and the prescribed threshold value.

BRIEF DESCRIPTION OF THE SEVERAL VIEWS OF THE DRAWINGS

The invention will be described in more detail below using an exemplary embodiment with reference to figures, in which.

DESCRIPTION OF THE INVENTION

Figure 3:
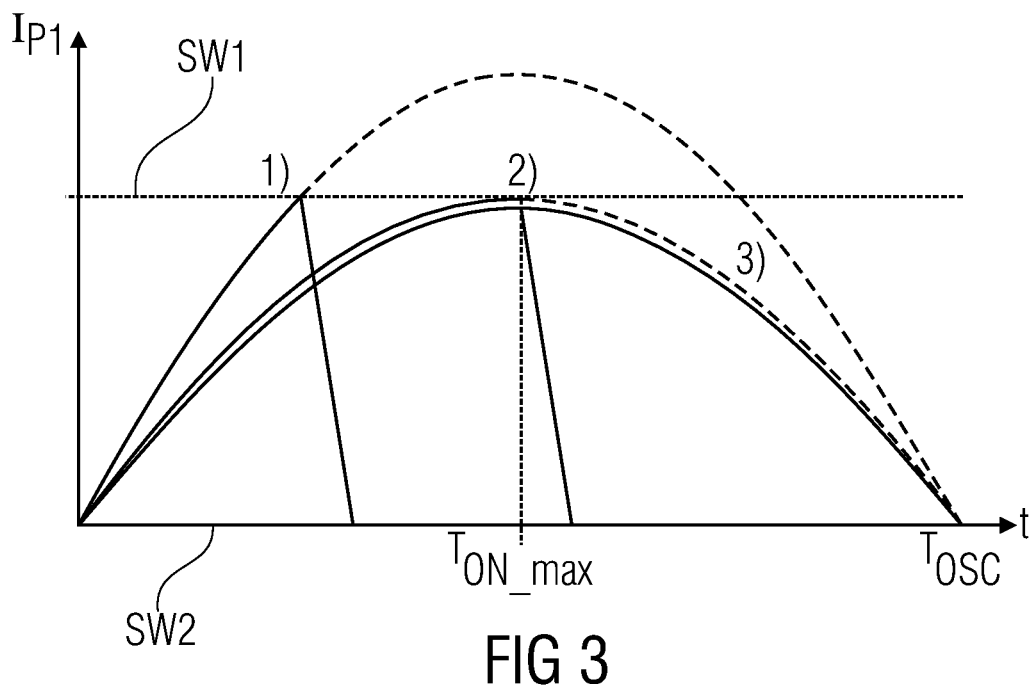
FIG. 3 shows the profile of charging currents of different magnitude for a prescribed shutdown threshold value.
Figure 4:
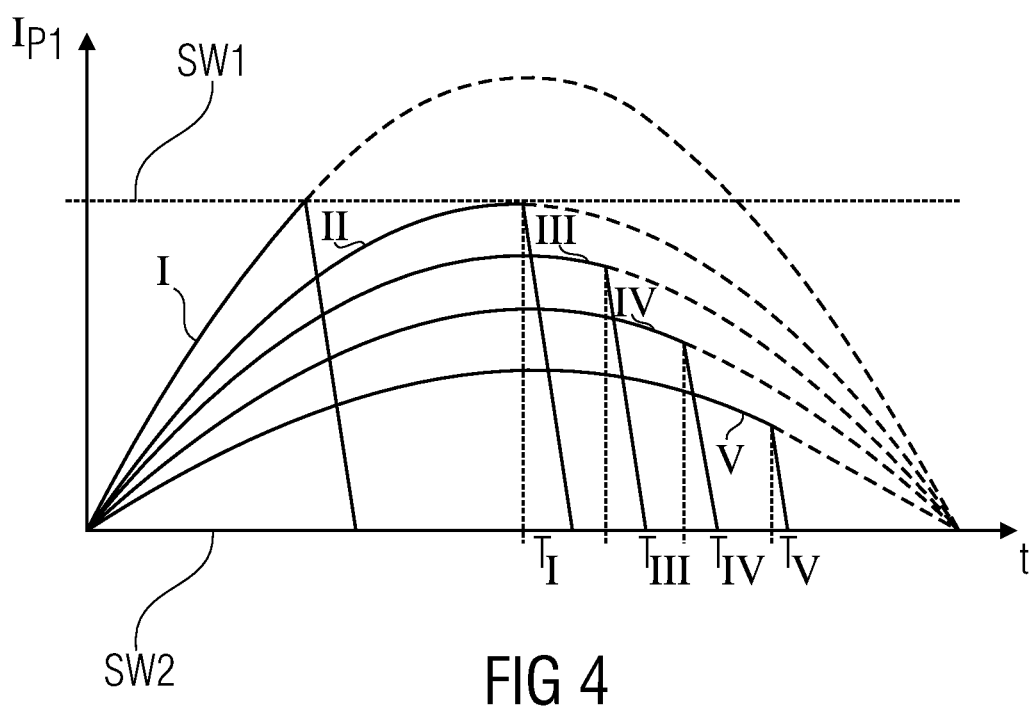
FIG. 4 shows inventive time-controlled shutdown of the charging current.

FIG. 4, like FIG. 3 already, first of all shows the profile of the current $I_{P1}$ through the capacitive actuator P1 in the case in which it is large enough to still reach the upper shutdown threshold value SW1. This is curve I. If it were not shut down, it would—as illustrated by dashed lines—run through a full sinusoidal half-cycle until it has decayed to 0 amp again.

Figure 1:
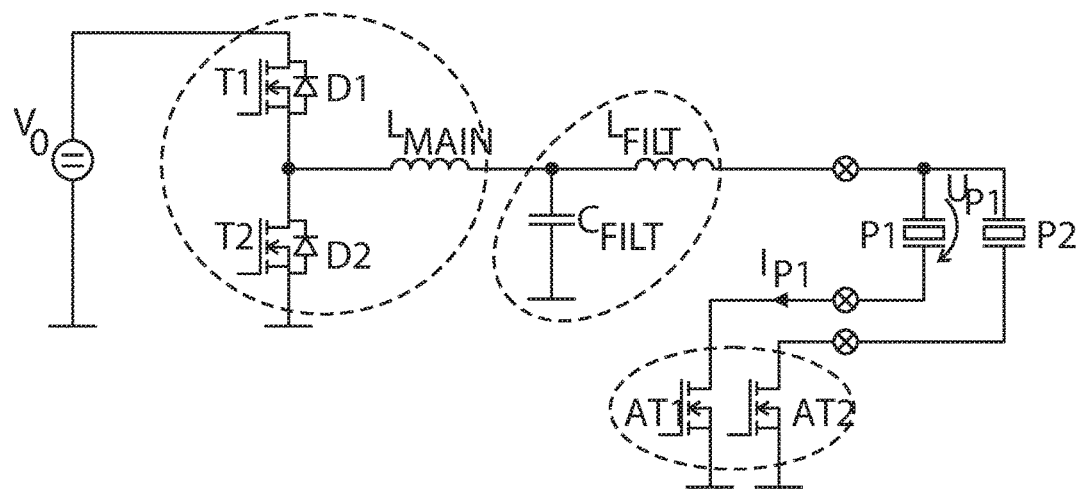
FIG. 1 shows a circuit arrangement for charging and discharging at least one capacitive actuator according to the prior art.
Figure 2:
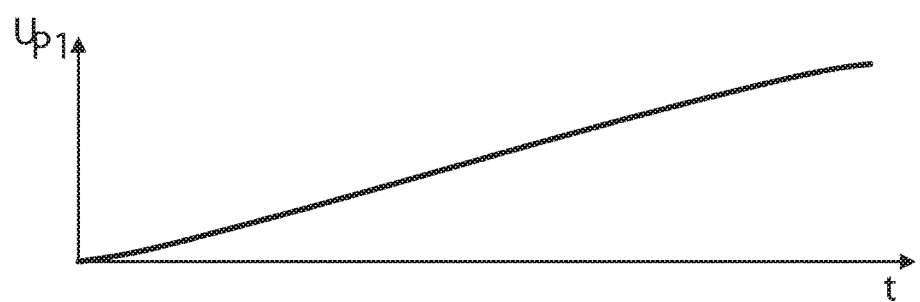
FIG. 2 shows the time profiles of the charging current and the charging voltage on a capacitive actuator.
Figure 2:
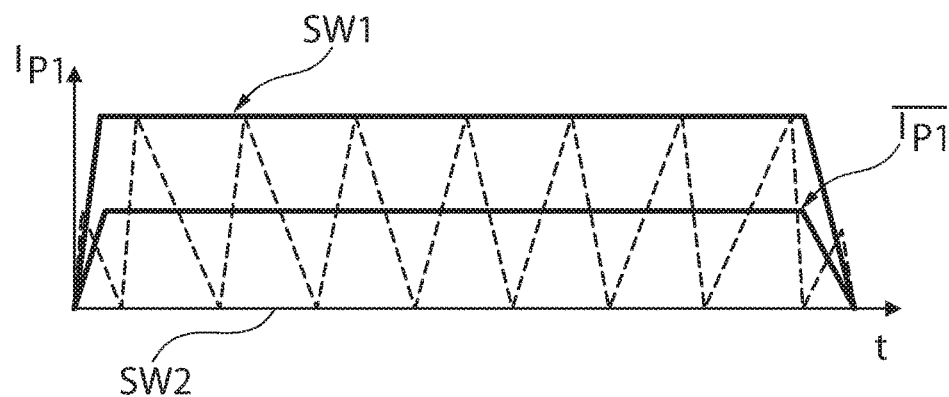

Furthermore, curve II is used to illustrate the case in which the charging current $I_{P1}$ just reaches the upper shutdown threshold value SW1 and therefore the first power transistor T1 is switched off, whereupon the current decays via the freewheeling path with the diode D2 (FIG. 1). The full sinusoidal half-cycle is shown by dashed lines in this case too.

Finally, curves III, IV and V are used to illustrate the time-controlled shutdown processes according to the invention. In these instances, the current through the capacitive actuator P1 is shut down at times $T_{III}$ and $T_{IV}$ and $T_V$ by virtue of the first power switch T1 being opened again at these very instants $T_{III}$, $T_{IV}$, $T_V$, which allows the current $I_{P1}$ to decay via the freewheeling path.

This shutdown control is effected by means of a flow control circuit, not shown in FIG. 1, which can be implemented using a microprocessor, for example. Said flow control circuit is also supplied with the measured currents by the capacitive actuators P1, P2 from current measuring circuits, not shown. The flow control circuit ascertains therefrom the maximum value and possibly the period until this value is reached and assigns a shutdown instant $T_{III}$ or $T_{IV}$ or $T_V$ to these. This can be accomplished using an algorithm that needs to be executed or else using stored characteristic data. The shutdown instants are in this case obtained from the sum of the time until the maximum value is reached by the current through the capacitive actuator and the subsequent period ascertained according to the invention.

In this way, charging with charge quantities of approximately equal magnitude can be effected in a manner according to the invention over the entire charging period, so that even expansion of the actuator can be achieved.

The invention claimed is:
1. A method of operating a circuit arrangement for charging and discharging at least one capacitive actuator, the circuit arrangement having:
a series circuit including first and second power transistors each with a respective parallel-connected diode and connected by way of a connecting node, said series circuit being connected between potentials of a supply voltage source;
a coil connecting said connecting node between said first and second power transistors to said at least one capacitive actuator;
the method comprising:
charging the capacitive actuator by periodically turning on the first power transistor that connects the capacitive actuator to a positive potential of the supply voltage source during a prescribable period of time and turning off the first power transistor when a first prescribed threshold value is reached by an actuator current through the capacitive actuator, until a second prescribed threshold value, which is lower than the first threshold value, is reached by the actuator current;
if, during a subsequent charging pulse, with the first power transistor turned on for charging the capacitive actuator, the actuator current no longer reaches the first prescribed threshold value, turning off the first power transistor after a period that corresponds to a maximum value reached by the actuator current for that charging pulse and that follows an instant at which the maximum value is reached for that charging pulse.

2. A method of operating a circuit arrangement for charging and discharging at least one capacitive actuator,
the circuit arrangement having:
a series circuit including first and second power transistors each with a respective parallel-connected diode and connected by way of a connecting node, said series circuit being connected between potentials of a supply voltage source;
a coil connecting said connecting node between said first and second power transistors to the at least one capacitive actuator;
the method comprising:
charging the capacitive actuator by periodically turning on the first power transistor that connects the capacitive actuator to a positive potential of the supply voltage source during a prescribable period of time and turning off the first power transistor when a first prescribed threshold value is reached by an actuator current through the capacitive actuator, until a second prescribed threshold value, which is lower than the first threshold value, is reached by the actuator current; and
if, during a subsequent charging pulse, with the first power transistor turned on for charging the capacitive actuator, the actuator current no longer reaches the first prescribed threshold value, turning off the first power transistor after a prescribed period that follows an instant at which a maximum value is reached for that charging pulse.

3. A method of operating a circuit arrangement for charging and discharging at least one capacitive actuator,
the circuit arrangement having:
a series circuit including first and second power transistors each with a respective parallel-connected diode and connected by way of a connecting node, said series circuit being connected between potentials of a supply voltage source;
a coil connecting said connecting node between said first and second power transistors to the at least one capacitive actuator;
the method comprising:
charging the capacitive actuator by periodically turning on the first power transistor that connects the capacitive actuator to a positive potential of the supply voltage source during a prescribable period of time and turning off the first power transistor when a first prescribed threshold value is reached by an actuator current through the capacitive actuator, until a second prescribed threshold value, which is lower than the first threshold value, is reached by the actuator current; and
if, during a subsequent charging pulse, with the first power transistor turned on for charging the capacitive actuator, the actuator current no longer reaches the first prescribed threshold value, turning off the first power transistor after a period of time that is dependent on a maximum value reached by the actuator current for that charging pulse, a period for reaching the maximum value for that charging pulse, and the prescribed threshold value and that follows an instant at which the maximum value is reached for that charging pulse.

* * * * *